United States Patent
Anderson et al.

(10) Patent No.: US 9,368,410 B2
(45) Date of Patent: Jun. 14, 2016

(54) SEMICONDUCTOR DEVICES HAVING TENSILE AND/OR COMPRESSIVE STRESS AND METHODS OF MANUFACTURING

(75) Inventors: Brent A. Anderson, Jericho, VT (US); Andres Bryant, Burlington, VT (US); Edward J. Nowak, Essex Junction, VT (US); Edmund J. Sprogis, Underhill, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 1473 days.

(21) Appl. No.: 12/033,280

(22) Filed: Feb. 19, 2008

(65) Prior Publication Data

US 2009/0206407 A1 Aug. 20, 2009

(51) Int. Cl.
  *H01L 29/78* (2006.01)
  *H01L 21/762* (2006.01)
  *H01L 21/8238* (2006.01)

(52) U.S. Cl.
  CPC .. *H01L 21/823807* (2013.01); *H01L 21/76205* (2013.01); *H01L 21/823878* (2013.01); *H01L 29/7846* (2013.01)

(58) Field of Classification Search
  CPC .............. H01L 21/76229; H01L 21/76865
  USPC ......... 257/336, 344, 408, 412, 510, 374, 394, 257/396, 513, 515; 438/236, 199, 216, 229, 438/230–233, 279, 424, 433
  See application file for complete search history.

(56) References Cited

U.S. PATENT DOCUMENTS

| | | | |
|---|---|---|---|
| 5,721,174 A * | 2/1998 | Peidous | 438/445 |
| 6,251,751 B1 | 6/2001 | Chu et al. | |
| 6,368,931 B1 * | 4/2002 | Kuhn et al. | 438/359 |
| 6,825,529 B2 | 11/2004 | Chidambarrao et al. | |
| 6,838,374 B2 * | 1/2005 | Uenishi et al. | 438/637 |
| 6,882,025 B2 * | 4/2005 | Yeo et al. | 257/510 |
| 6,960,781 B2 | 11/2005 | Currie et al. | |
| 6,962,838 B2 | 11/2005 | Anderson et al. | |
| 6,974,981 B2 | 12/2005 | Chidambarrao et al. | |
| 6,982,196 B2 | 1/2006 | Belyansky et al. | |
| 7,144,767 B2 | 12/2006 | Chidambarrao et al. | |
| 2002/0102814 A1 * | 8/2002 | Olsen | 438/424 |
| 2002/0135025 A1 * | 9/2002 | Park | 257/374 |
| 2004/0097030 A1 * | 5/2004 | Sayama et al. | 438/232 |
| 2004/0222463 A1 * | 11/2004 | Yeo et al. | 257/347 |
| 2005/0156274 A1 * | 7/2005 | Yeo et al. | 257/510 |
| 2006/0223279 A1 * | 10/2006 | Patraw et al. | 438/427 |
| 2007/0155121 A1 | 7/2007 | Frohberg et al. | |
| 2007/0207590 A1 * | 9/2007 | Kiyotoshi et al. | 438/424 |
| 2007/0224772 A1 | 9/2007 | Hall et al. | |

* cited by examiner

*Primary Examiner* — David Vu
*Assistant Examiner* — Jonathan Han
(74) *Attorney, Agent, or Firm* — Michael Lestrange; Andrew M. Calderon; Roberts Mlotkowski Safran & Cole, P.C.

(57) ABSTRACT

A semiconductor device and method of manufacturing is disclosed which has a tensile and/or compressive strain applied thereto. The method includes forming at least one trench in a material; and filling the at least one trench by an oxidation process thereby forming a strain concentration in a channel of a device. The structure includes a gate structure having a channel and a first oxidized trench on a first of the channel, respectively. The first oxidized trench creates a strain component in the channel to increase device performance.

24 Claims, 11 Drawing Sheets

US 9,368,410 B2

SEMICONDUCTOR DEVICES HAVING TENSILE AND/OR COMPRESSIVE STRESS AND METHODS OF MANUFACTURING

FIELD OF THE INVENTION

The present invention generally relates to semiconductor devices and methods of manufacturing the same, and more specifically, to semiconductor devices having a tensile and/or compressive strain applied thereto and methods of manufacturing.

BACKGROUND OF THE INVENTION

Mechanical strains within a semiconductor device substrate can modulate device performance by, for example, increasing the mobility of the carriers in the semiconductor device. That is, strains within a semiconductor device are known to enhance semiconductor device characteristics. Thus, to improve the characteristics of a semiconductor device, tensile and/or compressive strains are created in the channel of the n-type devices (e.g., NFETs) and/or p-type devices (e.g., PFETs), respectively. However, the same strain component, for example tensile strain or compressive strain, improves the device characteristics of one type of device (i.e., n-type device or p-type device) while discriminatively affecting the characteristics of the other type device.

Accordingly, in order to maximize the performance of both NFETs and PFETs within integrated circuit (IC) devices, the strain components should be engineered and applied differently for NFETs and PFETs. That is, because the type of strain which is beneficial for the performance of an NFET is generally disadvantageous for the performance of the PFET. More particularly, when a device is in tension (in the direction of current flow in a planar device), the performance characteristics of the NFET are enhanced while the performance characteristics of the PFET are diminished.

To selectively create tensile strain in an NFET and compressive strain in a PFET, distinctive processes and different combinations of materials are used. For example, liners on gate sidewalls have been proposed to selectively induce the appropriate strain in the channels of the FET devices. By providing liners the appropriate strain is applied closer to the device. While this method does provide tensile strains to the NFET device and compressive strains along the longitudinal direction of the PFET device, they may require additional materials and/or more complex processing, and thus, result in higher cost. Further, the level of strain that can be applied in these situations is typically moderate (i.e., on the order of 100s of MPa). Thus, it is desired to provide more cost-effective and simplified methods for creating larger tensile and compressive strains in the channels of the NFETs and PFETs, respectively.

To increase the strain levels in a device, an epitaxially grown SiGe layer has been used. When epitaxially grown on silicon, an unrelaxed SiGe layer will have a lattice constant that conforms to that of the silicon substrate. Upon relaxation (through a high temperature process for example), though, the SiGe lattice constant approaches that of its intrinsic lattice constant which is larger than that of silicon. Accordingly, when a silicon layer is epitaxially grown thereon, the silicon layer conforms to the larger lattice constant of the relaxed SiGe layer which results in a physical biaxial strain (e.g., expansion) to the silicon layer. This physical strain applied to the silicon layer is beneficial to the devices (e.g., CMOS devices) because the expanded silicon layer increases N type device performance and a higher Ge concentration in the SiGe layer improves P type device performances.

Relaxation in SiGe on silicon substrates occurs through the formation of misfit dislocations. The misfit dislocations facilitate the lattice constant in the SiGe layer to seek its intrinsic value by providing extra half-planes of silicon in the substrate. The mismatch strain across the SiGe/silicon interface is then accommodated and the SiGe lattice constant is allowed to get larger. However, misfit dislocations formed between the SiGe layer and the silicon epitaxial layer are random and highly non-uniform and cannot be easily controlled due to heterogeneous nucleation that cannot be easily controlled. Also, misfit dislocation densities are significantly different from one place to another. Thus, the physical strain derived from the non-uniform misfit dislocations are apt to be also highly non-uniform in the silicon epitaxial layer, and this non-uniform strain causes non-uniform benefits for performance with larger variability.

Accordingly, there exists a need in the art to overcome the deficiencies and limitations described hereinabove.

SUMMARY OF THE INVENTION

In a first aspect of the invention, a method comprises forming at least one trenches in a material; and filling the at least one trenches by an oxidation process thereby forming a strain concentration in a channel of a device.

In an additional aspect of the invention, a method comprises subjecting a channel of a device to a strain concentration by oxidizing at least one trench on the side of the channel until the at least one trench is filled and sidewalls thereof meet.

In a further aspect of the invention, a structure comprises a gate structure having a channel and at least one oxidized trench on a first side of the channel. The at least one oxidized trench creates a strain component in the channel to increase device performance.

In yet another aspect of the invention, a structure comprises a gate structure. A first oxidized trench forms a stress component on a first side of the gate structure and a second oxidized trench forms a stress component on a second side of the gate structure.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention relates to semiconductor devices having tensile and/or compressive strains and methods of manufacturing. By implementing the invention, it is now possible to increase electron mobility enhancement under a gate to increase device performance, regardless of the scale of the device. In implementation, the present invention eliminates the use of eSiGe or SiC by etching trenches into a wafer followed by an oxidation process to create localized strain regions that can be compressive or tensile. Advantageously, the use of trenches followed by an oxidation process is an additive process thereby allowing the strain component to be tailored very specifically for a particular device. As discussed further below, additional advantages include, amongst others:

(i) Simple/low cost processes which require a single mask and oxidation;
(ii) Strain direction is controllable by orientation of the trench (i.e., along the x and y axis);
(iii) Compressive or tensile strain can be created by location of trenches in a single process (whereas, nitride requires complimentary depositions and masks);
(iv) Strain magnitude can be controlled by size, location, amount of oxidation, and number of trenches by individual device;
(v) Large trenches can be used to isolate strain to local areas;
(vi) Strain can be introduced into the base wafer or directly into the gate level;
(vii) Strain trenches can be recessed and filled with silicon or poly silicon to allow for silicide formation;
(viii) Strain can be introduced prior to device formation;
(ix) Strain is additive with other forms of strain (alternative to eSiGe);
(x) The strain can be imparted into planar and multi-gate FET structures; and
(xi) Sensitive devices do not have to be strained.

First Aspect of the Invention

Figure 1:
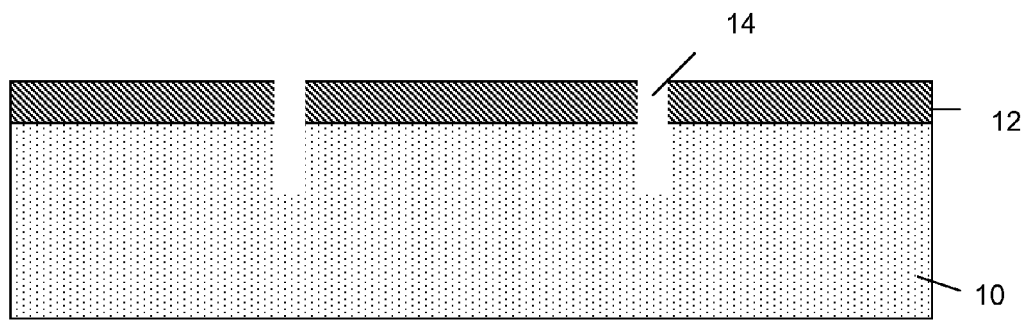
FIGS. 1-5B show structures and respective processing steps for forming a strained device in accordance with a first aspect of the invention.

FIG. 1 shows a starting structure and respective processing steps for forming a PFET in accordance with a first aspect of the invention. The starting structure includes, for example, an oxide nitride layer 12 deposited on a wafer 10 in a conventional deposition process. The wafer 10 can be any known type of wafer used with the formation of FETs. For example, the wafer 10 can be silicon, BULK, SOI, SiGe or Gallium arsenic, to name a few.

Still referring to FIG. 1, trenches 14 are etched into the wafer 10 using, for example, a conventional lithographic process. By way of illustration, a resist is placed over the deposited nitride layer 12. Selective portions of the resist are exposed to form openings. In subsequent processes, an etching takes place in order to form the trenches 14 in the wafer 10 (and layer 12). The resist is then stripped. In embodiments, for 45 nm technology, the trenches 14 are about 60 nm in depth and about 10 nm in width. Preferably, the width has an aspect ratio of between 3:1 to 20:1 and is typically 5:1 with relation to the depth of the trench.

Figure 5A:
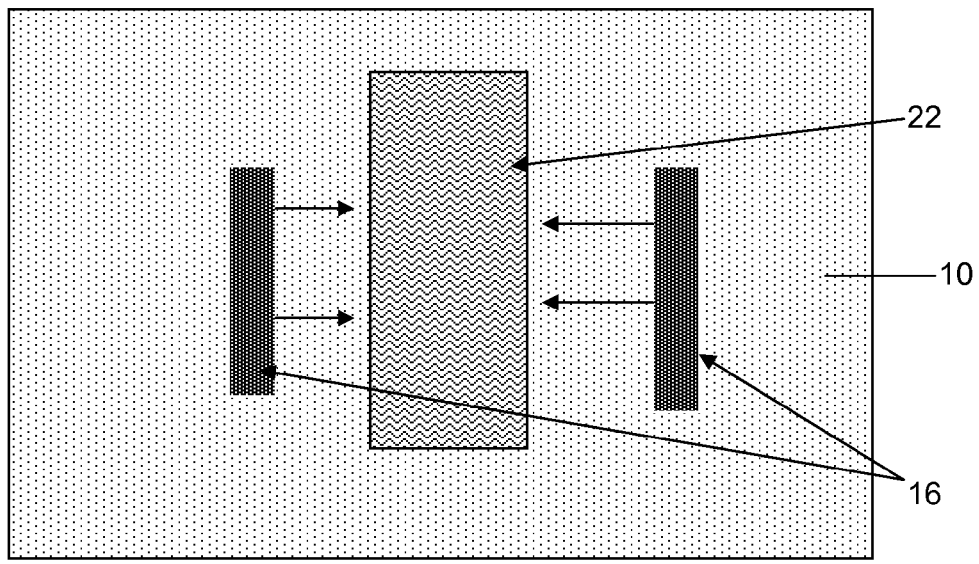
Figure 5B:
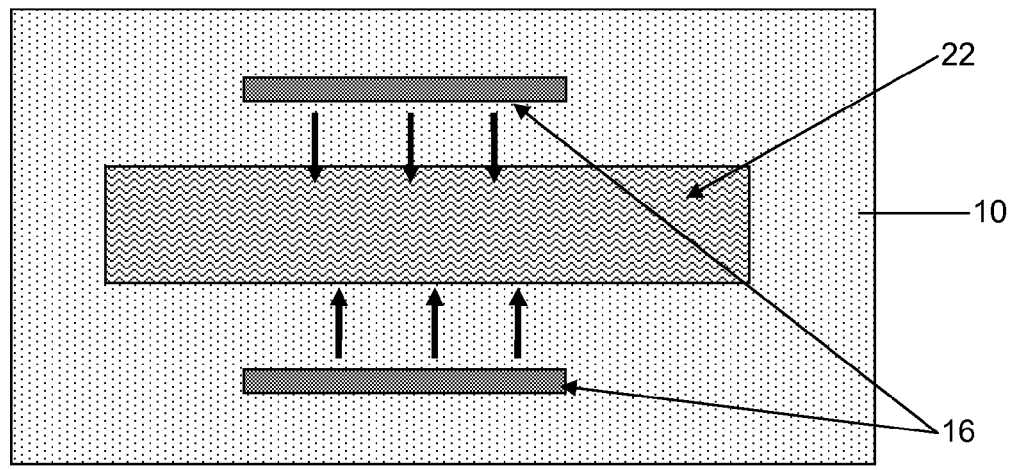

In all aspects of the invention, though, it should be understood that the size and location of the trenches can be varied depending on the technology application and desired strain concentration for each device on the wafer. For example, the placement, size and amount of trenches can be located in such a manner to provide a localized strain component about one device which is different than another device on the same wafer. Accordingly, although a single oxidized trench is typically provided on both sides of the gate, it is also contemplated that two or more oxidized trenches can be provided about the gate at varying locations, distances, and sizes to tailor the strain concentration for the device. For example, an I/O device may include two or more trenches on each side of a gate to increase the strain concentration. As the strain component is additive, e.g., each trench will add to the strain component, the addition of further trenches and subsequent oxidation process will increase the strain component, unlike other types of strain components. In addition, in embodiments (as shown in FIGS. 5A and 5B) the trenches can be formed in any orientation, e.g., x axis or y axis. Additionally, in some applications, it is contemplated that only a single trench is provided on one side of the gate. These applications would be, for example, in asymmetrical devices in which a strain would be beneficial in only a single direction.

Figure 2:
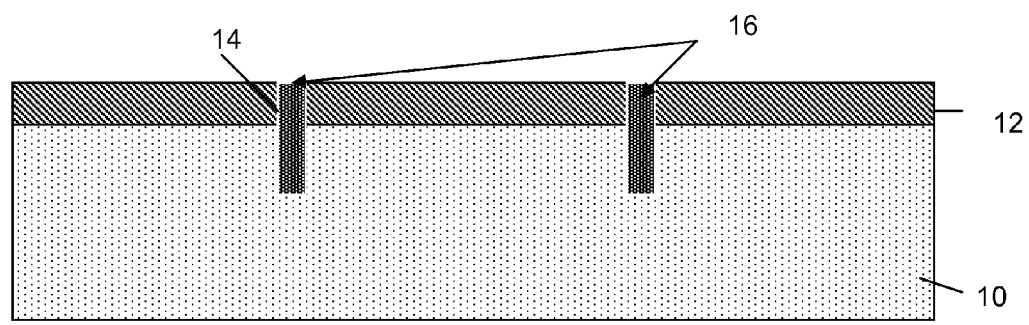

FIG. 2 shows an oxidation process in accordance with the present invention. In particular, an oxidation process is provided to completely fill the trenches 14. In embodiments, the oxidation process introduces oxygen into the lattice structure of the wafer 10 and as a result oxygen will build up on the sidewalls of the trenches 14 until the trenches 14 are completely filled with oxygen molecules 16. As the oxide builds up on the sidewalls of the trenches 14, the walls will touch, resulting in a strain concentration in the wafer 10. In embodiments, for uniformity, the oxidation process will continue until after the sidewalls have touched, which may result in a build up of a higher strain concentration. Also, as should be understood, the strain concentration will be higher with the more trenches that are available to be oxidized. In embodiments, the strain levels are upwards of about 1-2 GPa, depending on the size, location and amount of trenches.

Figure 3:
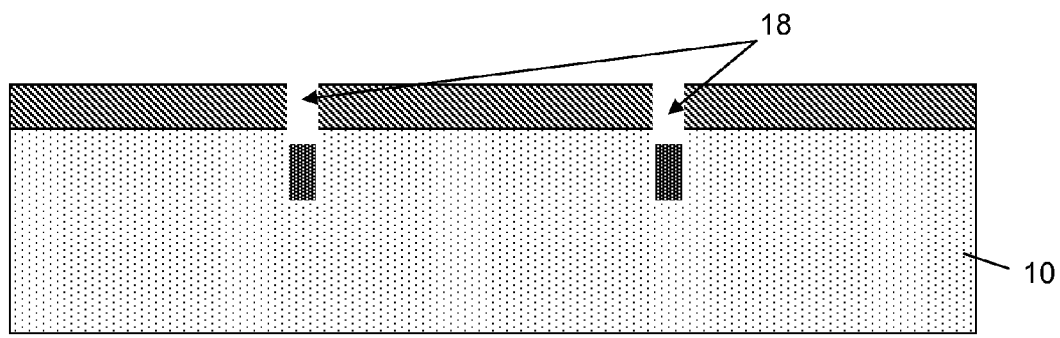

FIG. 3 shows a wet etching process in accordance with an aspect of the invention. In this processing step, the wet etching process is selective to the oxidized trenches. The etching of the oxidized trenches results in recesses 18, which is at a level below the surface of the wafer 10. In embodiments, the recesses 18 are about 15 nm below the surface of the wafer 10; although other depths are also contemplated by the invention depending on the technology application. The recesses 18 allow for silicide formation in later processing steps, during gate formation.

In embodiments, the wet etching process is optional, depending on the dimensions of the trenches. For example, in embodiments, contacts can be formed around the trenches, when the trenches are not of a large dimension.

Figure 4:
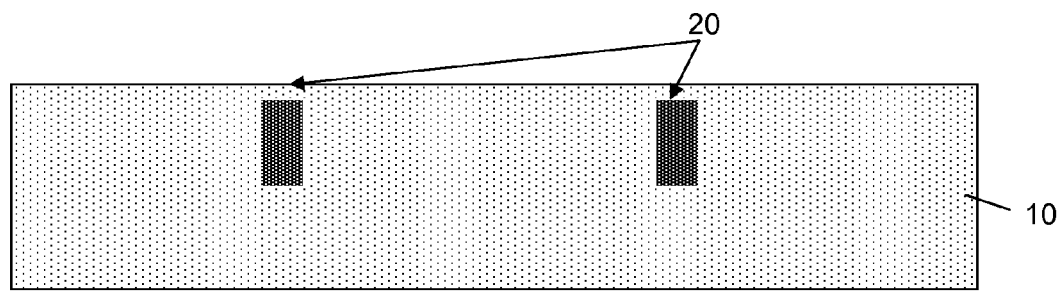

FIG. 4 shows an intermediate structure and respective processing steps in accordance with the first aspect of the invention. More specifically, in FIG. 4, silicon material 20 is deposited within the recesses 18. In further processing steps, the nitride layer is stripped. The structure is also planarized to form a substantially planar surface.

FIGS. 5A and 5B graphically show the strain concentrations in accordance with the first aspect of the invention. More specifically, the oxidized trenches are tailored to provide a localized compressive strain in the channel of the gate 22. In the application of a PFET device, the compressive strain increases the mobility of the carriers under the gate of the PFET. In embodiments, the strain component can be localized about the device. And, although a single oxidized trench is provided on both sides of the gate, it is also contemplated that two or more oxidized trenches can be provided about the gate at varying locations, distances, and sizes to tailor the strain concentration for the device. In addition, the locations, amount and sizes of the trenches can vary about each device on a wafer. For example, in some applications, it is contemplated that only a single trench is provided on one side of the gate. These applications would be, for example, in asymmetrical devices in which a strain would be beneficial in only a single direction.

Also, in embodiments, the strain component can be tailored to the specific device. For example, as shown in FIGS. 5A and 5B, the strain component can be provided in either the x axis or y axis, on the same wafer. This is accomplished by etching the trenches in different orientations.

Second Aspect of the Invention

Figure 6:
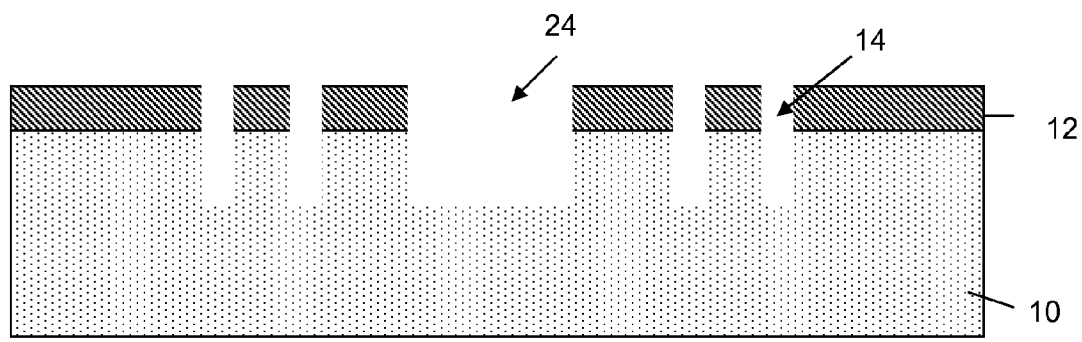
FIGS. 6-9 show structures and respective processing steps for forming a strained device in accordance with a second aspect of the invention.

FIG. 6 shows a starting structure and respective processing steps for forming a PFET or NFET in accordance with a second aspect of the invention. The starting structure includes, for example, an oxide nitride layer 12 deposited on a wafer 10 in a conventional deposition process. The wafer 10 can be any known type of wafer used with the formation of FETs. For example, the wafer 10 can be silicon, BULK, SOI, SiGe or Gallium arsenic, to name a few.

Still referring to FIG. 6, trenches 14 and 24 are etched into the wafer 10 using, for example, a conventional lithographic process in the manner described with respect to FIG. 1. Also, in embodiments, as noted with respect to FIG. 1, the trenches 14 can vary in amount, size, location and direction. Thus, although only two trenches 14 are shown, the present invention contemplates more than two trenches, again depending on the technology application and desired strain concentration.

In embodiments, the trench 24 has a width larger than that of the trenches 14, which will prevent the trench 24 from forming a strain concentration in the wafer during or as a result of the oxidation process. More specifically, the oxidation process will be monitored to ensure that oxygen will not build up on the sidewalls of the trench 24 to such an extent that the sidewalls meet. In this way, the trench 24 will form a strain isolation structure between the trenches and, more specifically, between trenches providing a strain concentration to different devices. It is also contemplated that trenches 24 can be provided in locations throughout the wafer, where no other structures are formed.

Figure 7:
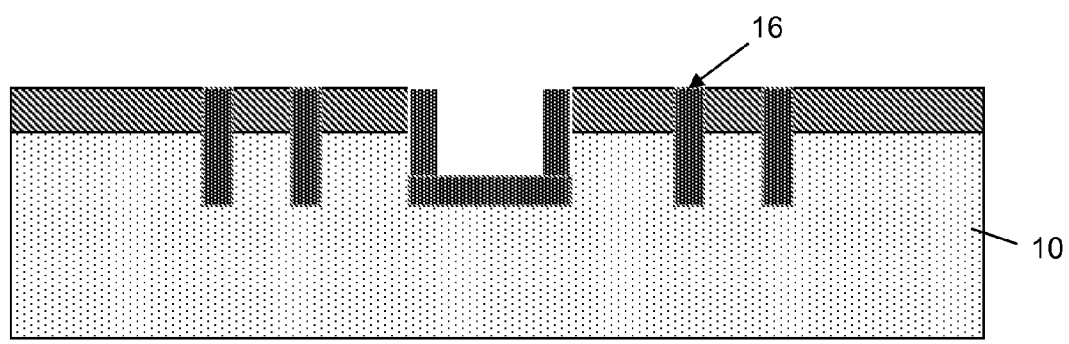

FIG. 7 shows the oxidation process in accordance with the present invention. In particular, the oxidation process completely fills the trenches 14; however, the oxidation process will not completely fill the trench 24. In this manner, as the trenches 14 fill, oxygen will build on the sidewalls of the trenches 14 until the trenches 14 are completely filled with the oxygen molecules 16. A strain component will result when the sidewalls touch. As previously discussed, in embodiments, for uniformity, the oxidation process will continue until after the sidewalls have touched in the trenches 14, which may result in a build up of a higher strain component. However, as the trench 24 is larger (wider) than that of the trenches 14, oxide on the sidewalls of the trench 24 will not touch and will thus not cause a strain component in the wafer 10. In fact, as discussed herein, the trench 24 will provide a strain isolation structure to prevent bowing or cracking of the wafer.

Figure 8:
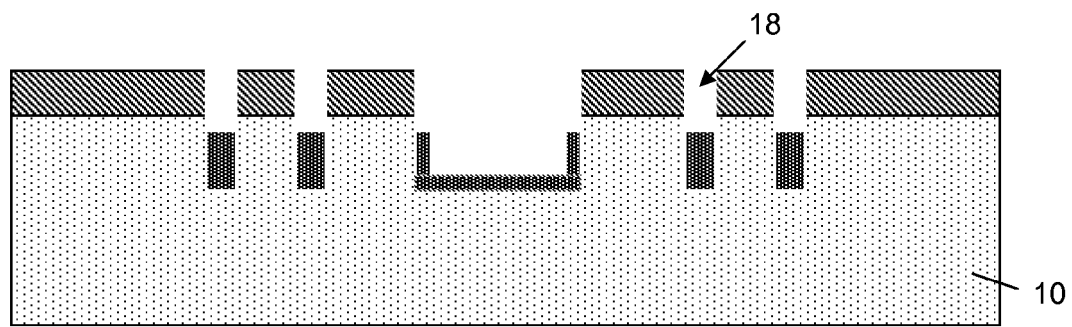

FIG. 8 shows a wet etching process in accordance with an aspect of the invention. In this processing step, the wet etching process is selective to oxygen, which results in the formation of the recesses 18. In embodiments, the recesses 18 are about 15 nm below the surface of the wafer 10; although, other depths are also contemplated by the invention depending on the technology application. Again, as discussed herein, in embodiments the wet etching process is optional, depending on the dimensions of the trenches 14.

Figure 9:
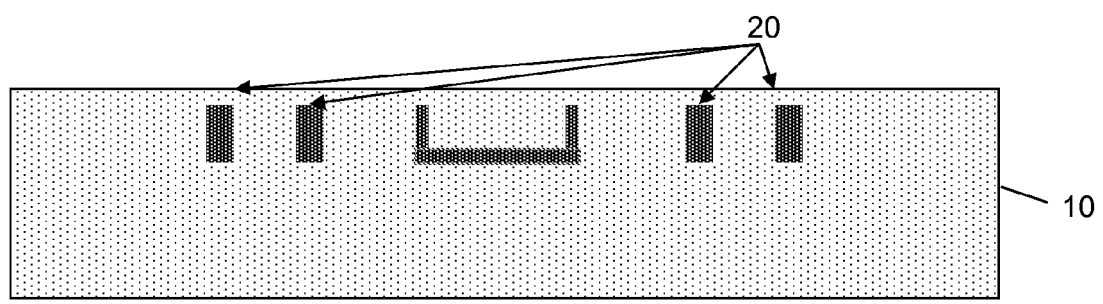

FIG. 9 shows an intermediate structure and respective processing steps in accordance with the first aspect of the invention. More specifically, in FIG. 9, silicon material 20 is deposited within the recesses 18. In further processing steps, the nitride layer is stripped. The structure is also planarized to form a substantially planar surface. Device formation can now follow using conventional processing steps.

Third Aspect of the Invention

FIGS. 10-13 show structures and respective processing steps in accordance with a third aspect of the invention. In particular, the starting structure of FIG. 10 includes, for example, a gate material 22 deposited on a wafer 10 using a conventional gate deposition process. The wafer 10 can be any known type of wafer used with the formation of FETs. For example, the wafer 10 can be silicon, BULK, SOI, SiGe or Gallium arsenic, to name a few. The gate material 22 can be, for example, polysilicon.

Figure 10:
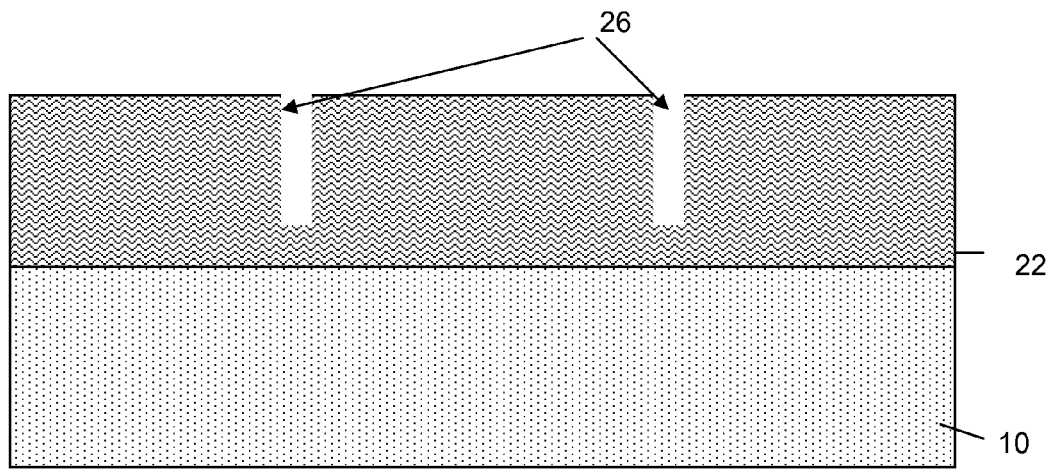
FIGS. 10-13 show structures and respective processing steps for forming a strained device in accordance with a third aspect of the invention.

Still referring to FIG. 10, trenches 26 are etched into the gate material 22 using, for example, a conventional lithographic process. By way of illustration, a resist is placed over the gate material 22. Selective portions of the resist are exposed to form openings. In subsequent processes, an etching takes place in order to form the trenches 26 in the gate material 22. The resist is then stripped. In embodiments, for 45 nm technology, the trenches 26 are about 60 nm in depth and about 10 nm in width. Preferably, the width has an aspect ratio of between 3:1 to 20:1 and is typically 5:1 with relation to the depth of the trench.

In embodiments, the size, orientation, location and amount of trenches 26 can be varied depending on the technology application and desired strain component. As such, although FIG. 10 shows two trenches, the present invention contemplates more than two trenches, again depending on the technology application and desired strain component.

Figure 11:
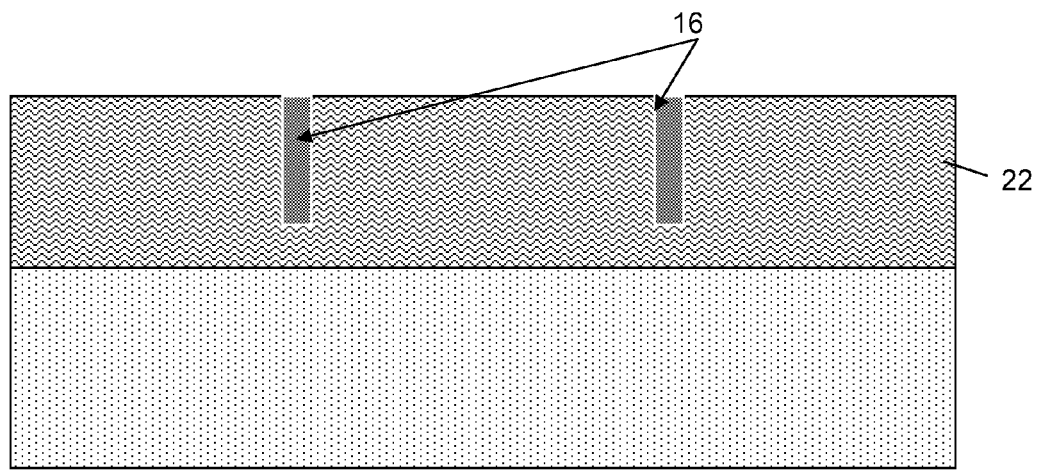

FIG. 11 shows an oxidation process in accordance with the present invention. In particular, the oxidation process completely fills the trenches 26 with oxygen molecules 16 resulting in a strain concentration provided in the channel of the gate. In embodiments, for uniformity, the oxidation process will continue until after the sidewalls have touched, which may result in a build up of a higher strain concentration. Also, as should be understood, the strain component will be higher with the more trenches that are available to be oxidized. In embodiments, the strain levels are upwards of about 1-2 GPa, depending on the size, location and amount of trenches.

Figure 12:
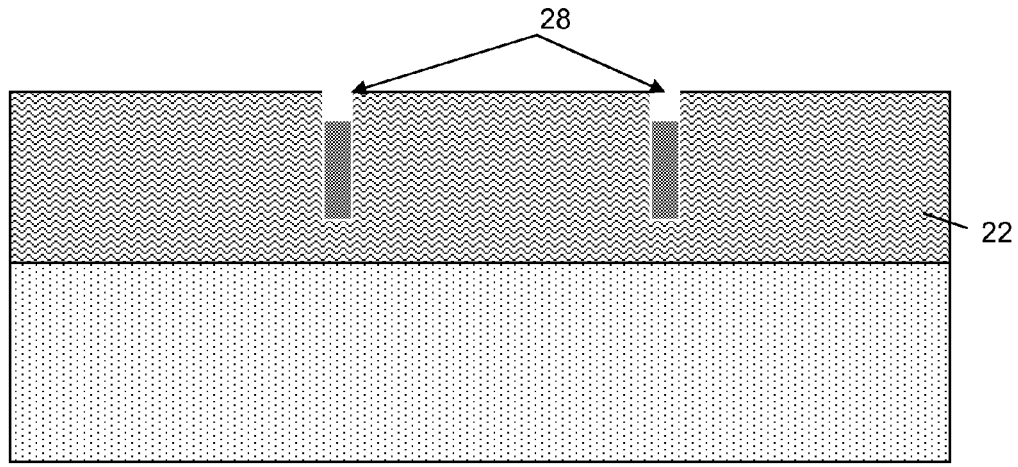

FIG. 12 shows a wet etching process in accordance with an aspect of the invention. In this processing step, the wet etching process is selective to oxygen thereby etching away the oxidized trenches to a level below the surface of the gate material 22. This results in the formation of the recesses 28. In embodiments, the recesses 28 are about 15 nm below the surface of the gate material 22, although, other depths are also contemplated by the invention depending on the technology application.

Figure 13:
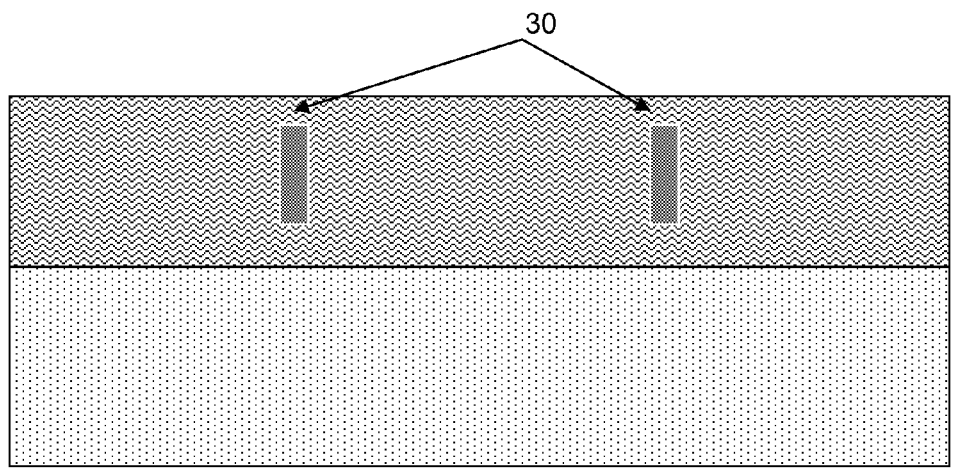

FIG. 13 shows an intermediate structure and respective processing steps in accordance with the third aspect of the invention. More specifically, in FIG. 13, gate material 30 is deposited within the recesses 18. In further processing steps, the structure is also planarized to form a substantially planar surface. Although not shown, remaining gate formation processes can be performed to form the FET of the device.

Fourth Aspect of the Invention

Figure 14:
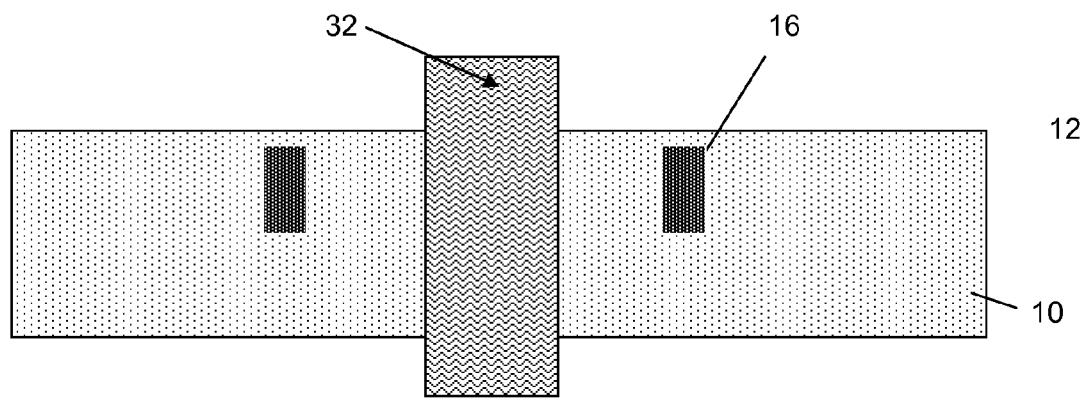
FIG. 14 shows a strained device in accordance with a fourth aspect of the invention.

FIG. 14 shows a strained device in accordance with a fourth aspect of the invention. This structure is representative of a FinFET device. In this embodiment, the strain concentration can be localized about the FinFET by forming the oxidized trenches 16 in the wafer 10 on side of the FinFET. Also, although a single oxidized trench 16 is provided on each side of the gate 32, it is also contemplated that two or more oxidized trenches can be provided about the FinFET at varying locations, distances, and sizes to tailor the strain concentration for the device. Additionally, in some applications, it is contemplated that only a single trench is provided on one side of the gate. These applications would be, for example, in asymmetrical devices in which a strain would be beneficial in only a single direction.

Fifth Aspect of the Invention

Figure 15A:
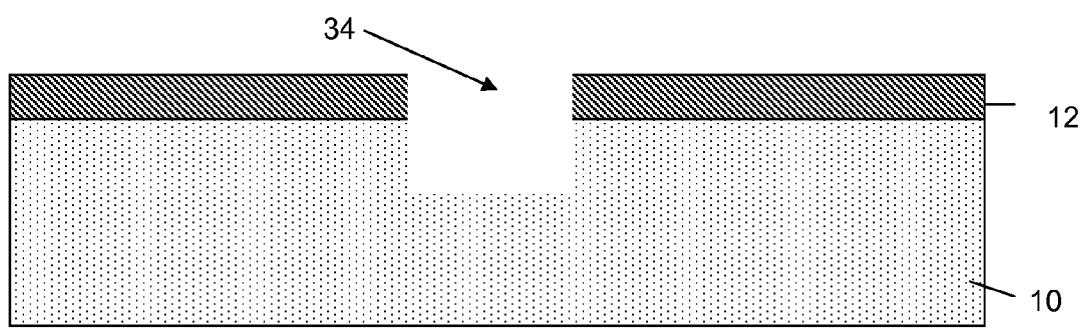
FIGS. 15-19 show structures and respective processing steps for forming a strained device in accordance with a third aspect of the invention.

FIG. 15a shows a starting structure and respective processing steps for forming an NFET in accordance with a fifth aspect of the invention. The starting structure includes, for example, an oxide nitride layer 12 deposited on a wafer 10 using a conventional deposition process. The wafer 10 can be any known type of wafer used with the formation of FETs. For example, the wafer 10 can be silicon, BULK, SOI, SiGe or Gallium arsenic, to name a few.

Still referring to FIG. 15a, trench 34 is etched into the wafer 10 using, for example, a conventional lithographic process. By way of illustration, a resist is placed over the layer 12. Selective portions of the resist are exposed to form an opening. In subsequent processes, an etching takes place in order to form the trench 34 in the wafer 10 (and layer 12). The trench 34 is provided in a non-active region of the device.

Figure 15B:
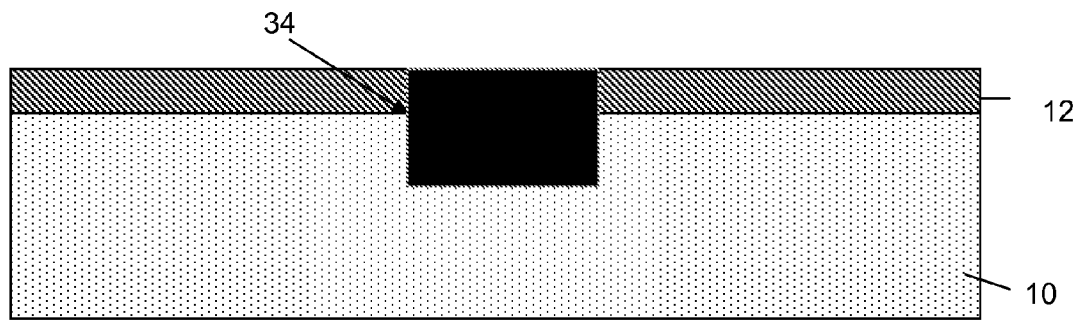

FIG. 15b shows deposition processes in accordance with the present invention. In particular, the deposition process includes depositing a non-compressive material in the trench 34 to form a non-compressive island 36. The non-compressive material may be a dielectric such as, for example, a nitride.

Figure 16A:
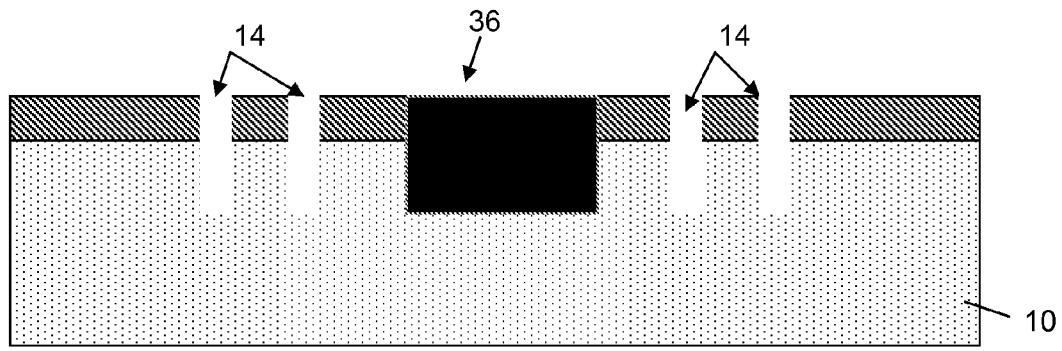

In FIG. 16a, while the non-compressive island 36 is protected, trenches 14 are etched into the wafer 10 using, for example, a conventional lithographic process. By way of illustration, a resist is placed over the layer 12. Selective portions of the resist are exposed to form openings. In subsequent processes, an etching takes place in order to form the trenches 14 in the wafer 10 (and layer 12). The resist is then stripped. In embodiments, the width of the trench 34 is larger than the width of the trenches 14.

In the embodiment shown, two trenches 14 are formed on each side of the trench 34. This will increase the strain component imposed on the NFET. Again, as discussed above, the location, size and amount of trenches 14 can be located in such a manner to provide a localized strain component about the device, depending on the specific technology application.

Figure 16B:
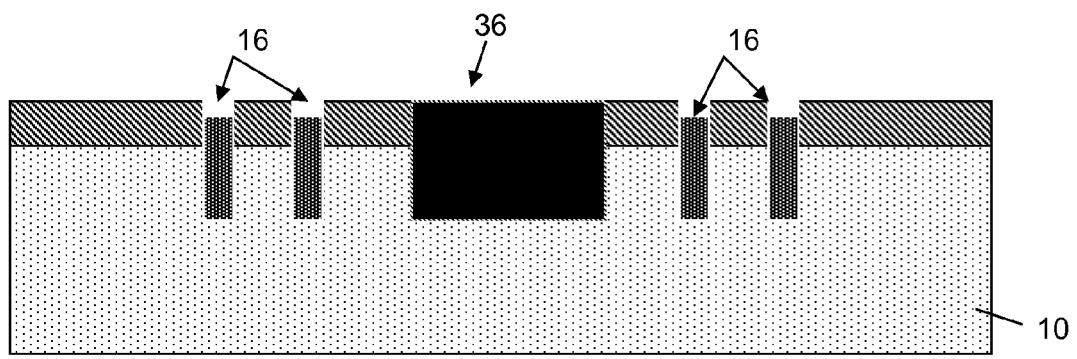

FIG. 16b shows oxidation processes in accordance with the present invention. In particular, the oxidation process introduces oxygen into the lattice structure of the wafer 10 to form oxidized trenches 16. As the oxide builds up on the sidewalls of the trenches 14, the sidewalls will touch resulting in a strain concentration in the wafer 10. In embodiments, for uniformity, the oxidation process will continue until after the sidewalls have touched, which may result in a build up of a higher strain concentration. In embodiments, the strain is a tensile strain due to the non-compressive material forming the island 36.

Figure 17:
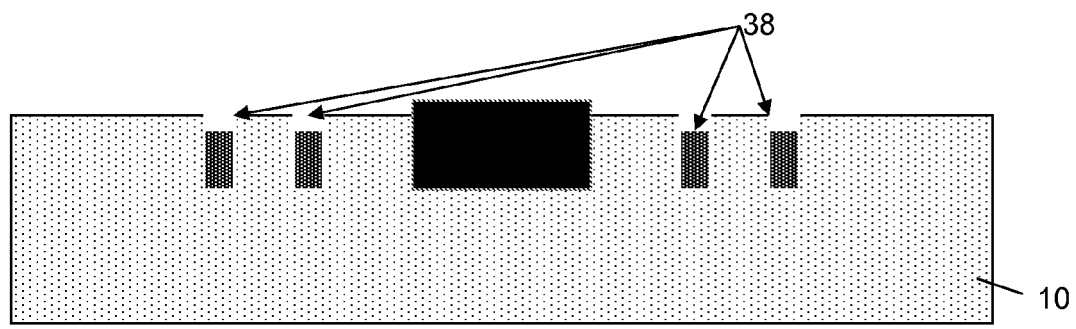

FIG. 17 shows a wet etching process in accordance with an aspect of the invention. In this processing step, the wet etching process is selective to oxygen and, in embodiments, the nitride, thereby etching away the oxidized trenches and a surface portion of the non-compressive material in the island 36 to recess the materials. The oxidized trenches 14 are etched to a level below the surface of the wafer 10, resulting in recesses 38. In embodiments, the recesses 38 are about 15 nm below the surface of the wafer, although, other depths are also contemplated by the invention depending on the technology application. The recesses 18 allow for silicide formation in later processing steps, during gate formation. In embodiments, the wet etching process is optional, depending on the dimensions of the trenches. In embodiments, the island still remains above a surface of the wafer 10.

Figure 18:
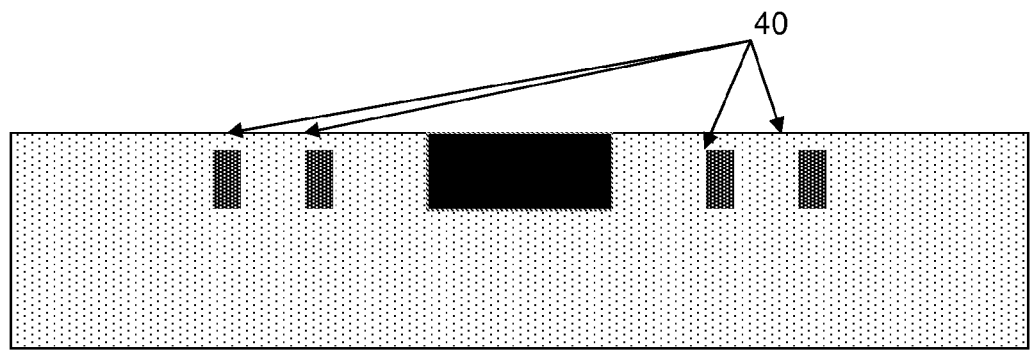

FIG. 18 shows an intermediate structure and respective processing steps in accordance with the fifth aspect of the invention. More specifically, in FIG. 18, silicon material 20 is deposited within the recesses 38. In further processing steps, the nitride layer is stripped. The structure is also planarized to form a substantially planar surface. Device formation can now follow using conventional processing steps.

Figure 19:
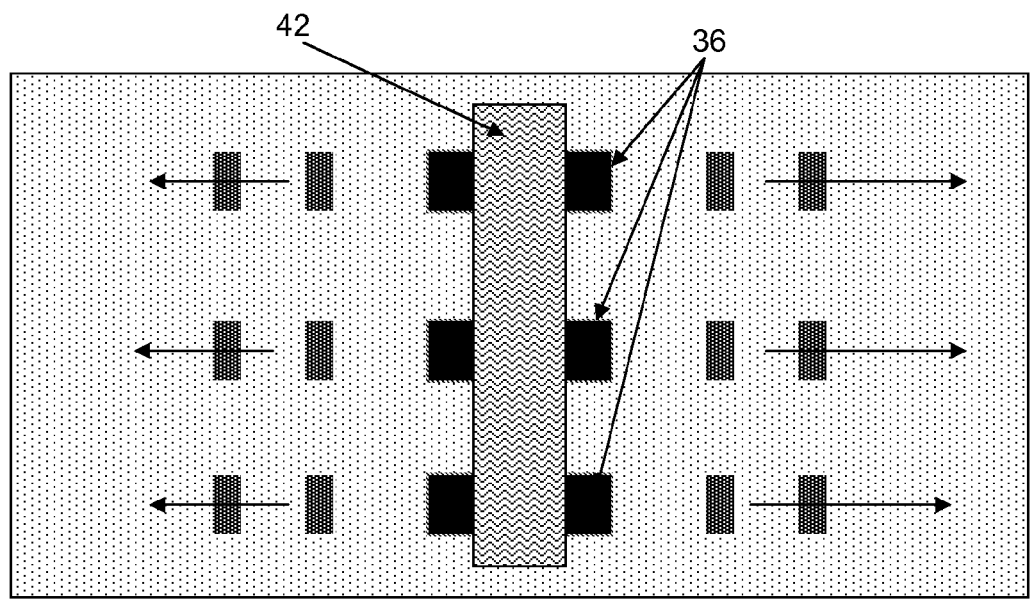

FIG. 19 graphically shows the tensile strain concentrations formed by the oxidized trenches and non-compressive islands 36 in accordance with the fifth aspect of the invention. More specifically, the oxidized trenches are tailored to provide a localized tensile strain against the gate 42. This is accomplished by providing the non-compressive islands 36 in inactive regions under the NFET device. That is, as the oxidized trenches would normally cause a compressive strain, the non-compressive islands 36 provide an opposing force to the normally compressive strains resulting in an outward tensile strain under the device.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those of skill in the art will recognize that the invention can be practiced with modifications and in the spirit and scope of the appended claims.

What is claimed is:

1. A method comprising:
   forming at least one trench in a material;
   filling the at least one trench by an oxidation process thereby forming a strain concentration in a channel of a device, the oxidation process completely filling the at least one trench with oxygen molecules which creates the strain concentration; and
   forming another trench that has a dimension larger than the at least one trench, the another trench forming a strain isolation structure by not being completely filled during the filling step.

2. The method of claim 1, wherein the at least one trench is at least two trenches and each trench of the at least the two trenches is formed on each side of the device in order to apply a compressive strain concentration in the channel of the device.

3. The method of claim 2, wherein the at least two trenches are at least four trenches, two of which are formed on each side of the device to provide an additional compressive strain concentration in the channel of the device.

4. The method of claim 2, further comprising forming the strain isolation structure between two trenches of the at least one trench, the strain isolation structure being associated with different devices.

5. The method of claim 2, further comprising forming a non-compressive island in an inactive region of a device, wherein the non-compressive island is between the at least two trenches thereby turning a compressive strain applied by the at least two filled trenches into a tensile strain in the channel of the device.

6. The method of claim 1, further comprising tailoring the at least one trench in at least one of orientation, size and location to adjust the strain concentration.

7. The method of claim 1, further comprising providing a recess in the at least one filled trench to a level below a surface of the wafer and filling the recess with silicon.

8. The method of claim 1, wherein the material is one of a wafer material and a gate material.

9. The method of claim 1, wherein the filling step includes building up the oxygen molecules on sidewalls of the at least one trenches until the at least one trench is completely filled with the oxygen molecules resulting in the sidewalls touching.

10. The method of claim 1, further comprising forming a recess in the at least one filled trench, filling the recess with silicon material and planarizing the silicon material to form a substantially planar surface.

11. The method of claim 1, further comprising forming another trench and filling the another trench with a non-compressive material to form a noncompressive island in an inactive region.

12. The method of claim 1, wherein the another trench that has a dimension larger than the at least one trench has oxide sidewalls that do not touch thereby creating the stain isolation structure.

13. The method of claim 12, wherein the oxide sidewalls are grown directly on the material comprising the another trench.

14. The method of claim 13, further comprising forming recesses in the at least one trench.

15. The method of claim 14, further comprising:
while forming the recesses in the at least one trench, etching portions of the oxide sidewalls of the another trench, to expose at least surfaces of an oxide nitride formed on the material;
removing the oxide nitride; and
filing the another trench with Si which covers the oxide sidewalls.

16. The method of claim 15, wherein the forming a Si is formed in the recesses.

17. The method of claim 1, wherein the at least one trench is completely filled.

18. A method comprising:
subjecting a channel of a device to a strain concentration by oxidizing at least one trench on a side of the channel until the at least one trench is filled and sidewalls thereof meet, the oxidizing completely filling the at least one trench with oxygen molecules which creates the strain concentration;
forming another trench that has a dimension larger than the at least one trench, the another trench forming a strain isolation structure by not being completely filled;
forming a recess in the at least one filled trench;
filling the recess with silicon material; and
planarizing the silicon material to form a substantially planar surface.

19. The method of claim 18, wherein the at least one trench is formed in one of a wafer prior to formation of the device and in a gate material.

20. The method of claim 18, further comprising forming a strain isolation structure within a wafer to prevent at least bowing of the wafer.

21. The method of claim 18, further comprising forming a non-compressive island which effectively provides a tensile strain to the channel by directing away a compressive strain created by the filled at least one trench.

22. The method of claim 18, further comprising tailoring the at least one trench in at least one of orientation, size and location to adjust the strain concentration in the wafer.

23. The method of claim 18, wherein the at least one trench is completely filled with oxide.

24. The method of claim 23, wherein:
the another trench that has a dimension larger than the at least one trench has oxide sidewalls that do not touch thereby creating the stain isolation structure;
the oxide sidewalls are grown directly on the material comprising the another trench;
while forming the recess in the at least one trench, etching portions of the oxide sidewalls of the another trench, to expose at least surfaces of an oxide nitride formed on the material;
removing the oxide nitride; and
filing the another trench with Si which covers the oxide sidewalls.

* * * * *